US 12,148,624 B2

United States Patent
Hu et al.

(10) Patent No.: US 12,148,624 B2
(45) Date of Patent: Nov. 19, 2024

(54) WET ETCH PROCESS AND METHOD TO CONTROL FIN HEIGHT AND CHANNEL AREA IN A FIN FIELD EFFECT TRANSISTOR (FINFET)

(71) Applicant: Tokyo Electron Limited, Tokyo (JP)

(72) Inventors: Shan Hu, Albany, NY (US); Eric Chih-Fang Liu, Albany, NY (US); Henan Zhang, Albany, NY (US); Sangita Kumari, Albany, NY (US); Peter Delia, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 200 days.

(21) Appl. No.: 17/942,387

(22) Filed: Sep. 12, 2022

(65) Prior Publication Data

US 2024/0087909 A1    Mar. 14, 2024

(51) Int. Cl.
     *H01L 21/311*      (2006.01)

(52) U.S. Cl.
     CPC ............... *H01L 21/31111* (2013.01)

(58) Field of Classification Search
     None
     See application file for complete search history.

(56) References Cited

U.S. PATENT DOCUMENTS

| | | | |
|---|---|---|---|
| 3,979,241 A | 9/1976 | Maeda et al. | |
| 8,673,709 B2 | 3/2014 | Lee et al. | |
| 9,455,325 B2 | 9/2016 | Wann et al. | |
| 9,460,970 B2 | 10/2016 | Mor et al. | |
| 9,865,598 B1* | 1/2018 | Bi | H01L 21/31144 |
| 2013/0203263 A1* | 8/2013 | Shimada | H01L 29/78 252/79.1 |
| 2018/0138053 A1 | 5/2018 | Yao et al. | |
| 2021/0265172 A1* | 8/2021 | Fu | H01L 21/76883 |
| 2021/0407794 A1* | 12/2021 | Chang | H01L 21/0337 |
| 2022/0098485 A1 | 3/2022 | Vereecke | |
| 2022/0130722 A1* | 4/2022 | Parikh | H01L 21/76816 |

OTHER PUBLICATIONS

Ueda, "Effect Of Hydrophobicity And Surface Potential Of Silicon On SiO2 Etching In Nonometer-Sized Narrow Spaces", Trans Tech Publications, 2021, 6 pgs.

Watanabe et al., "High Selectively (SiN/SiO2) Etching Using An Organic Solution Containing Anhydroud HF", Microelectronic Engineering, 2009, 1 pg.

(Continued)

*Primary Examiner* — Shamim Ahmed

(74) *Attorney, Agent, or Firm* — Egan, Enders & Huston LLP

(57) ABSTRACT

Embodiments of improved process flows and methods are provided in the present disclosure to control fin height and channel area in a fin field effect transistor (FinFET) having gaps of variable CD. More specifically, the present disclosure provides improved transistor fabrication processes and methods that utilize a wet etch process, instead of a dry etch process, to remove the oxide material deposited within the gaps formed between the fins of a FinFET. By utilizing a wet etch process, the improved transistor fabrication processes and methods described herein provide a means to adjust or individually control the fin height of one or more the fins, thereby providing greater control over the channel area of the FinFET.

20 Claims, 14 Drawing Sheets

(56) References Cited

OTHER PUBLICATIONS

Okuyama et al., "Impact Of Electrostatic Effects On Wet Etching Phenomenon In Nanoscale Region", Trans Tech Publications, 2015, 5 pgs.
Polster et al., "The Electrical-Double Layer Revisted", Natural Sciences, Dec. 2021, 10 pgs.
Zubel et al., "Silicon Anisotropic Etching In Alkaline Solutions IV: The Effect Of Organic And Inorganic Agents On Silicon Anisotropic Etching Process", Sensors And Actuators A Physical, Jan. 2001, 1 pg.
MicroChemicals, "Wet-Chemical Etching Of Silicon and Sio2", Anisotropic Etching Of Silicon, Basics Of Microstructuring, Obtained from Internet Jul. 12, 2022, 7 pgs.
Microchemicals, "Wet Chemical Etching—Basics", Basics Of Microstructuring, Obtained from Internet Jul. 12, 2022, 8 pgs.
Virginia Semiconductor, "Wet-Chemical Etching And Cleaning Of Silicon", Jan. 2003, 11 pgs.
Li et al., "Evaluation On Dispersion Behavior Of The Aqueous Copper Nano-Suspensions", Journal Of Colloid And Interface Science, Mar. 2007, 9 pgs.
Jovanovic et al., "FinFET Technology For Wide-Channel Devices With Ultra-Thin Silicon Body", University of Zagreb, Department Of Electronics, Obtained from Internet Jul. 12, 2022, 5 pgs.
Boukortt et al., "Effects Of Varying The Fin Width, Fin Height, Gate Dielectric Material, And Gate Length On The DC And RF Performance Of A 14-nm SOI FinFET Structure", Electronics, Dec. 2021, 17 pgs.

* cited by examiner

900

Providing a patterned substrate, the patterned substrate having: (a) a plurality of fins that extend vertically from a surface of the patterned substrate, and (b) an oxide material that is formed on the plurality of fins and within gaps provided between the plurality of fins, wherein a critical dimension (CD) of the gaps varies across the plurality of fins; and — 910

Etching the oxide material by exposing the patterned substrate to an etch solution, wherein said etching controls the fin height in the FinFET fabrication process by removing the oxide material deposited within the gaps at different etch rates. — 920

FIG. 9

WET ETCH PROCESS AND METHOD TO CONTROL FIN HEIGHT AND CHANNEL AREA IN A FIN FIELD EFFECT TRANSISTOR (FINFET)

BACKGROUND

The present disclosure relates to transistor fabrication. In particular, the present disclosure provides improved processes and methods for fabricating fin field effect transistors (FinFET) transistors.

Field effect transistors, or FETs, are one example of devices that may be formed on a semiconductor substrate using a variety of semiconductor processing techniques. The fabrication of FETs typically involves multiple steps of layer deposition, patterning and etching to define various structures on and/or within a substrate. For example, one type of FET may generally include a source region, a drain region, a channel region positioned between the source region and the drain region, and a gate structure (or simply "gate") positioned over the channel region. In a planar FET, such as a metal-oxide-semiconductor field effect transistor (MOSFET), the source, drain and channel regions are formed within the substrate, and the gate structure is formed above the substrate over the channel region.

FinFET transistors were developed to improve the operating speed of transistors, while avoiding the deleterious effects often seen when the channel length is reduced in planar MOSFET designs (such as leakage currents that occur in a short channel device when the transistor is switched "off"). Unlike planar MOSFET transistors, FinFET transistors are three-dimensional (3D) transistor designs that use "fins" to form a raised channel between the source and drain regions of the FinFET. In a FinFET design, the gate structure wraps around the raised channel on multiple sides of the fin. The greater surface area provided between the gate structure and the channel region reduces leakage currents in the transistor "off" state and enables lower gate voltages to be used to turn the FinFET "on." Thus, FinFETs typically provide better performance and reduced power consumption compared to planar MOSFET designs.

FIGS. 1A-1B (Prior Art) illustrate an example FinFET 100, which is formed on one or more underlying layers, such as an oxide layer 130 and base substrate layer 132. As known in the art and shown in FIG. 1A, FinFET 100 may generally include one or more fins 112 that extend vertically from the base substrate layer 132, and a gate structure 120 that is oriented orthogonal to the one or more fins 112. Although one fin 112 is shown in FIG. 1A, it is recognized that FinFET 100 may include a plurality of fins 112, as is known in the art. Each fin 112 includes a source region 114, a drain region 116 and a channel region 118 positioned between the source and drain regions. As shown in FIGS. 1A-1B, the gate structure 120 wraps around the channel region 118 of each fin 112, covering the fin on three sides. As shown in FIG. 1B, a gate oxide layer 122 is formed between the channel region 118 of the fin 112 and the gate structure 120. In some embodiments, a sidewall spacer layer 124 may be formed adjacent to the gate structure 120 on either side of the gate, as shown in FIG. 1A.

Although FinFETs offer power, performance and scaling benefits, they are not without manufacturing challenges. As transistor geometries continue to shrink, the technical challenges to forming various features of FinFET transistors via photolithography techniques increase. Self-aligned multiple patterning (SAMP) processes, which were developed to reduce feature sizes beyond what is directly achievable via lithography, have been utilized to form FinFET transistors. Examples of SAMP processes include self-aligned double patterning (SADP) processes, self-aligned triple patterning (SATP), self-aligned quadruple patterning (SAQP) and self-aligned octuple patterning (SAOP) processes.

As known in the art, SAMP processes use a mandrel (or "core") structure having spacers, which are formed on either side of the mandrel, to increase the density of the features formed on a substrate surface. In SADP, for example, mandrels may be formed on a substrate through known photolithography techniques using a wide variety of materials, including but not limited to, silicon, silicon nitride, hard mask materials, spin on carbon (SOC), photoresist, silicon oxide, etc. Once the mandrels are formed, sidewall spacers are formed adjacent to, and on either side of, each mandrel. The spacers can be formed from any of a wide variety of materials (such as, e.g., oxides, nitrides, titanium oxide, titanium nitride, etc.) through use of a conformal deposition process (such as, e.g., atomic layer deposition (ALD), chemical vapor deposition (CVD), physical layer deposition (PVD), etc.) and subsequent spacer etch process. At some point, a mandrel pull step may be performed to remove the originally patterned mandrels, leaving two sidewall spacers on the substrate for each mandrel.

FIGS. 2A-2E (Prior Art) illustrate an example SADP process flow that may be used to form the fins of a FinFET in a conventional FinFET fabrication process. FIG. 2A (Prior Art) is a cross-section diagram of a patterned substrate 200 after a mandrel formation process, spacer deposition process and spacer etch process have been performed to form a plurality of mandrels 220 and sidewall spacers 230 on the patterned substrate 200. The mandrel formation process and the spacer deposition process may be implemented, for example, using plasma deposition processes. The spacer etch process may be implemented, for example, using a plasma etch process.

The mandrels 220 may generally be formed on one or more underlying layers. In the embodiment shown in FIG. 2A, the underlying layers include a hard mask (HM) layer 215, an antireflective coating (ARC) layer 210 and a base substrate layer 205. It is recognized, however, that different or additional underlying layers could also be provided. In some cases, the width, or critical dimension ($CD_m$), of the mandrels 220 formed on the underlying layers may be the same. In other cases, mandrels having different width (or CD) may be formed on the underlying layers, as shown in FIG. 2A. After the mandrels 220 are formed, a spacer layer 225 may be deposited over the mandrels 220 and etched to expose the mandrels 220 and create spacers 230 adjacent to the mandrels 220. The spacers 230 formed adjacent to the mandrels 220 may have a uniform width, or critical dimension ($CD_{sp}$), which is not dependent on the width of the mandrels. The base substrate layer 205, the ARC layer 210, the HM layer 215 and the spacer layer 225 may each be formed from a wide variety of materials, as is known in the art.

FIG. 2B (Prior Art) is a cross-section diagram of the patterned substrate 200 after a mandrel pull process has been performed to remove the mandrels 220 from between the spacers 230. The mandrel pull process can be implemented, for example, using a plasma etch process, which removes the mandrels 220 by exposing the patterned substrate to a plasma 235. Ions and reactive species within the plasma 235 selectively etch the material used to form the mandrels 220, leaving the spacers 230 on the underlying layers.

FIG. 2C (Prior Art) is a cross-section diagram of the patterned substrate 200 after a fin etch process has been performed to form a plurality of fins 240 within the underlying base substrate 205. The fin etch process can forms the fins 240 by exposing the patterned substrate to a plasma 245. Ions and reactive species within the plasma 245 selectively etch portions of the underlying layers not covered by the spacers 230 to form gaps 250 between the fins 240.

During the fin etch process, the spacers 230 are used as a mask for etching exposed portions of the underlying layers to form the gaps 250 between the fins 240. As a result of such etching, the plurality of fins 240 formed on the patterned substrate 200 may have a uniform width (W), or critical dimension ($CD_{fin}$), which is dependent on and substantially equal to the critical dimension ($CD_{sp}$) of the spacers 230 used to form the fins 240. However, the CD of the gaps 250 formed between the fins 240 is dependent on the width of the mandrels 220, and thus, may differ when different sized mandrels are used. In the example embodiment shown in FIG. 2C, some of the fins 240 are separated by gaps 250a having smaller CD ($CD_{g1}$), while other fins 240 are separated by gaps 250b having larger CD ($CD_{g2}$).

FIG. 2D (Prior Art) is a cross-section diagram of the patterned substrate 200 after an oxide deposition process has been performed to deposit an oxide material 255 (e.g., silicon dioxide, $SiO_2$) within the gaps 250 formed between the plurality of fins 240. The oxide deposition process may be implemented, for example, using a plasma deposition process. Once the oxide material 255 is deposited, the oxide material 255 may be etched to adjust the fin height (H) of the plurality of fins 240.

FIGS. 2E-2F (Prior Art) illustrate a dry etch process, which may be used in the conventional FinFET fabrication process to adjust the fin height (H) of the plurality of fins. As shown in FIG. 2E, the oxide material 255 is etched by exposing the patterned substrate to a plasma 260. When the patterned substrate 200 is exposed to the plasma 260, ions and reactive species within the plasma 260 selectively etch the oxide material 255 to reduce the thickness of the oxide material deposited within the gaps 250. The dry etch process shown in FIG. 2E may continue until a desired fin height (H) is achieved, as depicted in FIG. 2F.

As known in the art, the channel area of a FinFET is equal to n*(W*H), where 'n' is the number of fins included within the FinFET, 'W' is the width and 'H' is the height of the fins. The conventional fabrication process shown in FIGS. 2A-2F forms fins 240 having constant width (W) and constant height (H). In this method, the channel area can only be changed (by whole number increment only) by changing the number (n) of fins included within the FinFET. In some cases, an integrated circuit device may require FinFETs having different channel area in different function areas of the device. This is difficult to do when the conventional fabrication process shown in FIGS. 2A-2F is used to form the FinFETs.

As front end of the line (FEOL) scaling continues, it becomes more and more desirable to reduce the width (W), while increasing the height (H), of the fins 240. However, it's difficult to shrink the width of the fins 240 using conventional process flows. In the conventional SADP process flow shown in FIGS. 2A-2F, the fin width (which is controlled by the CD of the spacer 230) is constant. However, the CD of the gaps 250 (which is controlled by the CD of mandrels 220) can be different. Integrated circuit chip designers prefer to have the freedom to control the fin height for different gap CD. This is not possible when the conventional fabrication process shown in FIGS. 2A-2F is used to form the FinFETs.

SUMMARY

The present disclosure provides various embodiments of improved process flows and methods to control fin height and channel area in a fin field effect transistor (FinFET) having gaps of variable CD. More specifically, the present disclosure provides improved transistor fabrication processes and methods that utilize a wet etch process, instead of a dry etch process, to remove the oxide material deposited within the gaps (or spaces) formed between the plurality of fins of a FinFET. By utilizing a wet etch process, the improved transistor fabrication processes and methods described herein provide a means to adjust or individually control the fin height of one or more the fins, thereby providing greater control over the channel area of the FinFET.

According to one embodiment, a method is provided herein that uses wet etching to control fin height in a fin field effect transistor (FinFET) fabrication process. In general, the method may begin by providing a patterned substrate, the patterned substrate having: (a) a plurality of fins that extend vertically from a surface of the patterned substrate, and (b) an oxide material that is formed on the plurality of fins and within gaps provided between the plurality of fins. A critical dimension (CD) of the gaps may vary across the plurality of fins. For example, the plurality of fins may include a first set of fins separated by a first gap having a smaller CD and a second set of fins separated by a second gap having a larger CD. The method may further include etching the oxide material by exposing the patterned substrate to an etch solution, wherein said etching controls the fin height in the FinFET fabrication process by removing the oxide material deposited within the gaps at different etch rates.

According to another embodiment, a method is provided that uses wet etching to control channel area in a fin field effect transistor (FinFET) fabrication process. As in the previous embodiment, the method may generally begin by providing a patterned substrate, the patterned substrate having: (a) a number (n) of fins of constant width (W) that extend vertically from a surface of the patterned substrate, and (b) an oxide material that is formed on the plurality of fins and within gaps provided between the plurality of fins. A critical dimension (CD) of the gaps may vary across the plurality of fins. For example, the plurality of fins may include a first set of fins separated by a first gap having a smaller CD and a second set of fins separated by a second gap having a larger CD. The method may further include etching the oxide material by exposing the patterned substrate to an etch solution, wherein said etching removes the oxide material deposited within the gaps at different etch rates to adjust the height (H) of one or more of the plurality of fins and control the channel area (n*W*H) in the FinFET fabrication process. In some embodiments, the method may further include adjusting the number (n) of fins included on the patterned substrate to further control the channel area (n*W*H) in the FinFET fabrication process.

In some embodiments, the plurality of fins may comprise a silicon containing material that exhibits a negative surface potential when exposed to aqueous solutions in a given pH range. A wide variety of etch solutions may be utilized in the methods disclosed herein to etch the oxide material formed on the plurality of fins and within the gaps provided between the plurality of fins.

In some embodiments, the etch solution may include one or more etchant chemicals and an organic solvent. For example, the one or more etchant chemicals may include at least one of hydrofluoric acid (HF), ammonium hydroxide (NH$_4$OH), hydrochloric acid (HCl), hydrogen peroxide (H$_2$O$_2$), nitric acid (HNO$_3$), phosphoric acid (H$_3$PO$_4$), potassium hydroxide (KOH) and Tetramethylammonium hydroxide (TMAH). The organic solvent may include one or more of methanol (CH$_4$O), ethanol (C$_2$H$_6$O), isopropyl alcohol (C$_3$H$_8$O), benzyl alcohol (C$_7$H$_8$O), ethylene glycol (C$_2$H$_6$O$_2$), acetic acid (CH$_3$COOH), acetone (C$_3$H$_6$O), propylene carbonate (C$_4$H$_6$O$_3$), n-hexane (C$_6$H$_{14}$), cyclohexane (C$_6$H$_{12}$), diethyl ether (C$_4$H$_{10}$O), tetrahydrofuran (C$_4$H$_8$O), benzene (C$_6$H$_6$), toluene (C$_7$H$_8$), dichloromethane (CH$_2$Cl$_2$), trichloroethylene (C$_2$HCl$_3$), 1,1,1-trichloroethane (C$_2$H$_3$Cl$_3$), 1,2-dichloroethane (C$_2$H$_4$Cl$_2$), N-methyl-2-pyrrolidone (C$_5$H$_9$NO), dimethyl sulfoxide (C$_2$H$_6$OS), ethyl lactate (C$_5$H$_{10}$O$_3$), ethanolamine (C$_2$H$_7$NO) and propylene glycol methyl ether acetate (C$_6$H$_{12}$O$_3$). When an etch solution comprising one or more etchant chemicals and an organic solvent is used, as described above, said etching may remove the oxide material from the first gap faster than the oxide material is removed from the second gap to provide the first set of fins with a height, which is greater than the height of the second set of fins.

In other embodiments, the etch solution includes one or more etchant chemicals and an aqueous solvent. For example, the one or more etchant chemicals may include at least one of hydrofluoric acid (HF), ammonium hydroxide (NH$_4$OH), hydrochloric acid (HCl), hydrogen peroxide (H$_2$O$_2$), nitric acid (HNO$_3$), phosphoric acid (H$_3$PO$_4$), potassium hydroxide (KOH) and Tetramethylammonium hydroxide (TMAH). The aqueous solvent may be water. When an etch solution comprising one or more etchant chemicals and an aqueous solvent is used, as described above, said etching may remove the oxide material from the first gap slower than the oxide material is removed from the second gap to provide the first set of fins with a height, which is less than the height of the second set of fins.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 8A-8D and 8G-8H illustrate another embodiment of an improved transistor fabrication process that utilizes a wet etch process to control the fin height in a FinFET transistor design having gaps of variable CD; and FIG. 9 is a flowchart diagram illustrating one embodiment of a method that uses wet etching to control fin height in a FinFET fabrication process.

DETAILED DESCRIPTION

Figure 1A:
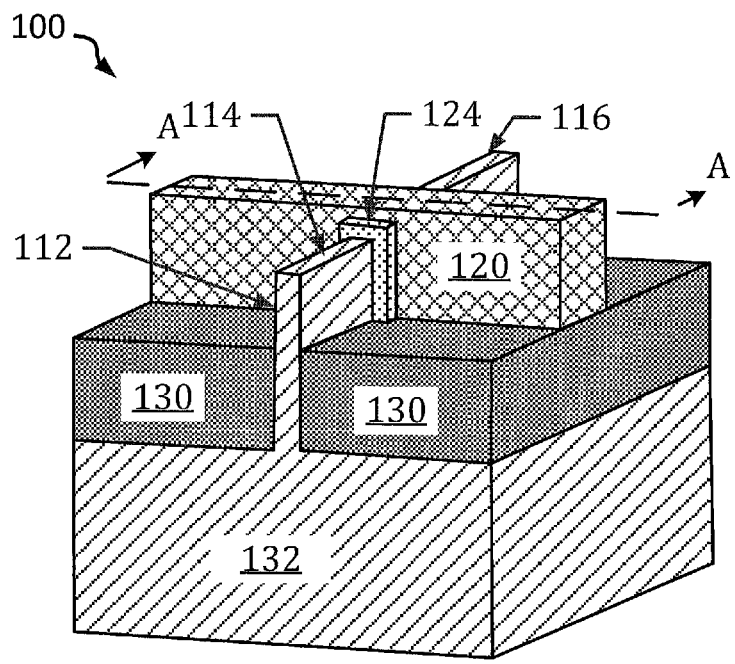
FIG. 1A (Prior Art) is a 3D diagram illustrating one example of a fin field effect transistor (FinFET) formed on a substrate.

The present disclosure provides various embodiments of improved process flows and methods to control fin height and channel area in a fin field effect transistor (FinFET) having gaps of variable CD. More specifically, the present disclosure provides improved transistor fabrication processes and methods that utilize a wet etch process, instead of a dry etch process, to remove the oxide material deposited within the gaps (or spaces) formed between the plurality of fins of a FinFET. By utilizing a wet etch process, the improved transistor fabrication processes and methods described herein provide a means to adjust or individually control the fin height of one or more the fins, thereby providing greater control over the channel area of the FinFET.

In the disclosed embodiments, a patterned substrate is provided having: (a) a plurality of fins that extend vertically from a surface of the patterned substrate, and (b) an oxide material that is formed on the plurality of fins and within gaps provided between the plurality of fins, and a wet etch process is performed to etch the oxide material. During the wet etch process, the patterned substrate is exposed to an etch solution, which reacts with the oxide material and promotes dissolution of reaction products to etch the oxide material deposited on the plurality of fins and within the gaps formed between the fins. When etching the oxide material deposited within the gaps, the rate at which material is removed from the gaps (i.e., the etch rate) may differ depending on a variety of factors, such as the critical dimension (CD) of the gaps, the etchant chemical(s) used within the etch solution, the solvent used within the etch solution, the ratio of etchant chemical(s) to solvent used within the etch solution, the pH of the etch solution and the wall material adjacent to the oxide material being etched. The difference in etch rate within the gaps is known in the art as CD-dependent etching.

In some FinFET transistor designs, the critical dimension (i.e., the width) of the gaps formed between the fins may vary across the FinFET. When gaps of variable CD are present, a wet etch process may be used to remove the oxide material deposited within the gaps faster within gaps having smaller CD and slower within gaps having larger CD (or vice versa), depending on the etch solution used to remove the oxide material. For example, a non-aqueous organic-based etch solution or an aqueous-based etch solution may be used to etch the oxide material deposited within the gaps. When a non-aqueous organic-based etch solution is used, the wet etch process described herein may etch the oxide material faster within gaps having smaller CD and slower within gaps having larger CD. However, the opposite is true when an aqueous-based etch solution is used to etch the oxide material. By taking advantage of the CD-dependent etching provided by wet etch processes, the improved transistor fabrication processes and methods disclosed herein are able to more precisely control fin height and channel area in a FinFET having gaps of variable CD.

Figure 3A:
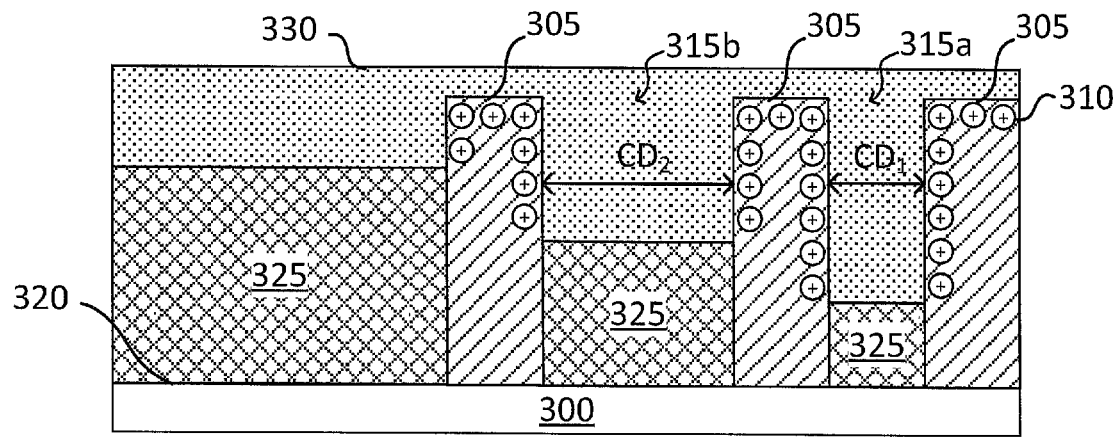
FIG. 3A is a cross-sectional view through a substrate having features of different critical dimension (CD) illustrating CD-dependent etching of material within the features when the substrate is exposed to a non-aqueous organic-based etch solution.
Figure 3B:
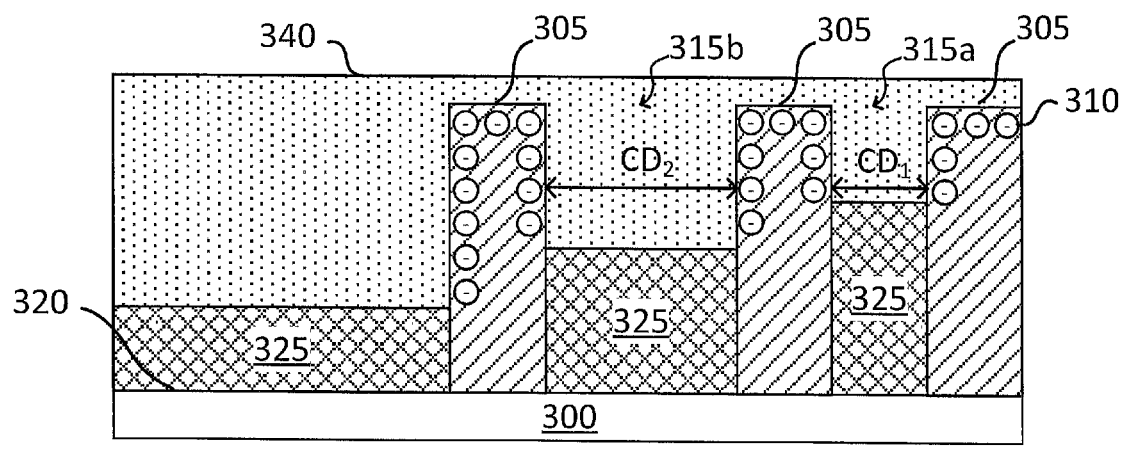
FIG. 3B is a cross-sectional view through a substrate having features of different critical dimension (CD) illustrating CD-dependent etching of material within the features when the substrate is exposed to an aqueous-based etch solution.
Figure 4:
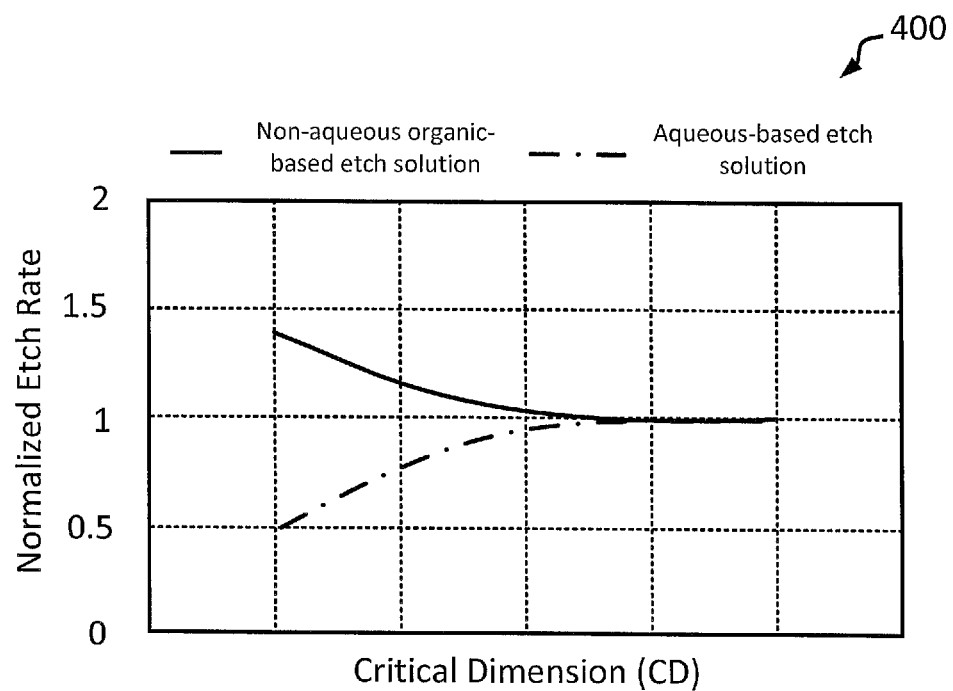
FIG. 4 is a graph illustrating normalized etch rate vs. feature CD when the substrate is exposed to a non-aqueous organic-based etch solution and an aqueous-based etch solution.

FIGS. 3A-3B and 4 illustrate CD-dependent etching of material deposited within features (e.g., gaps, trenches, holes, etc.) having different CD when a substrate is exposed to a non-aqueous organic-based etch solution (FIGS. 3A and 4) and an aqueous-based solution (FIGS. 3B and 4). As used herein, an aqueous-based etch solution 340 is a solution that includes one or more etchant chemicals mixed with an aqueous solvent (e.g., water ($H_2O$) or deionized water). A non-aqueous organic-based etch solution 330, on the other hand, is a solution that includes one or more etchant chemicals mixed with an organic solvent. In some embodiments, the non-aqueous organic-based etch solution 330 may include an etchant chemical that contains water (e.g., hydrofluoric acid (HF) containing for example 49% HF and 51% water, or ammonium hydroxide ($NH_4OH$) containing for example 29% $NH_4OH$ and 71% water, in terms of weight %) and thus, may include a minimal amount of water.

The substrate 300 shown in FIGS. 3A-3B is provided with a plurality of structures 305 (e.g., fins, lines, etc.) that extend above a surface of the substrate. Each of the plurality of structures 305 is separated by a feature 315 (e.g., a gap, trench, hole, etc.). A critical dimension (CD) of the features 315 may be the same, or may be different, as shown in FIGS. 3A-3B. In the example embodiments shown in FIGS. 3A-3B, the substrate 300 is depicted as having a first feature 315a having a smaller CD ($CD_1$) and a second feature 315b having a larger CD ($CD_2$). The CD of the plurality of features 315 is relatively small (e.g., less than 100 nm) compared to more planar areas 320 of the substrate 300 surrounding the plurality of structures 305. The features 315 shown in FIGS. 3A and 3B are bound by a wall material 310 (e.g., silicon-containing material) that exhibits a negative surface potential when exposed to aqueous solutions in a given pH range.

A material 325 deposited onto a surface of the substrate 300, the plurality of structures 305 and within the features 315 formed between the plurality of structures 305 is etched. The material 325 being etched may include a wide variety of semiconductor materials. For example, the material 325 may be an oxide or other dielectric material. In one example, the material 325 may be a silicon oxide (such as, e.g., silicon dioxide, $SiO_2$). Other oxide and dielectric materials, including low-k dielectric materials, may also be formed within the plurality of features 305 and etched.

The wall material 310 adjacent to the material 325 being etched may also include a wide variety of materials. In some embodiments, the material 325 may be adjacent to a wall material 310 that exhibits a negative surface potential when exposed to an aqueous-based etch solution 340 in a given pH range, as shown in FIG. 3B. Examples of wall materials 310 having negative surface potential when exposed to aqueous solutions include silicon-containing materials, such as but not limited to, amorphous silicon (a-Si), polysilicon (poly-Si), silicon carbon nitride (SiCN) and silicon oxynitride (SiON). It is recognized that the material 325 may also be formed adjacent to other wall materials 310 not specifically mentioned herein.

In the embodiment shown in FIG. 3A, the substrate 300 is exposed to non-aqueous organic-based etch solution 330 that includes one or more etchant chemicals and an organic solvent. Examples of etchant chemicals that may be included within a non-aqueous organic-based etch solution 330 include, but are not limited to, hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH), Tetramethylammonium hydroxide (TMAH) and other etchant chemicals containing an anion (negatively charged ion) as the main reactive species.

A wide variety of organic solvents may be used within the non-aqueous organic-based etch solution 330 described herein. Examples of organic solvents that may be included within the non-aqueous organic-based etch solution 330 include, but are not limited to, various alcohols (e.g., methanol ($CH_4O$), ethanol ($C_2H_6O$), isopropyl alcohol ($C_3H_8O$), benzyl alcohol ($C_7H_8O$), etc.), polyhydric alcohols (e.g., ethylene glycol ($C_2H_6O_2$) etc.), acetic acid ($CH_3COOH$), ketones (e.g., acetone ($C_3H_6O$), propylene carbonate ($C_4H_6O_3$), etc.), alkanes (e.g., n-hexane ($C_6H_{14}$), cyclohexane ($C_6H_{12}$), etc.), ethers (e.g., diethyl ether ($C_4H_{10}O$), tetrahydrofuran ($C_4H_8O$), etc.), aromatic hydrocarbons (e.g., benzene ($C_6H_6$), toluene ($C_7H_8$), etc.), halogen compounds (e.g., dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), etc.), nitrogen compounds (e.g., N-methyl-2-pyrrolidone ($C_5H_9NO$), etc.), sulfuric compounds (e.g., dimethyl sulfoxide ($C_2H_6OS$), etc.), and other volatile, carbon-based solvents such as ethyl lactate ($C_5H_{10}O_3$), ethanolamine ($C_2H_7NO$) and propylene glycol methyl ether acetate ($C_6H_{12}O_3$).

In some embodiments, the non-aqueous organic-based etch solution 330 may include an etchant chemical containing an anion as the main reactive species (e.g., hydrofluoric acid, ammonium hydroxide or hydrochloric acid) mixed with an alcohol (e.g., isopropyl alcohol, IPA), a polyhydric alcohol (e.g., ethylene glycol, EG), acetic acid (AA) or a ketone (e.g., propylene carbonate, PC). In at least one preferred embodiment, the non-aqueous organic-based etch solution 330 may include hydrofluoric acid mixed with IPA, AA, EG or PC. Other organic solvents described herein may also be mixed with hydrofluoric acid or other etchant chemicals (such as $NH_4OH$ or HCl) containing an anion as the main reactive species. Although the etchant chemicals described herein can be mixed with many different organic solvents, the compatibility and solubility of the etchant chemical(s) and organic solvent must be carefully considered.

When substrate 300 is exposed to a non-aqueous organic-based etch solution 330 containing anions as the main reactive species, portions of the features 315 exposed to the non-aqueous organic-based etch solution 330 may exhibit a positive surface potential, as shown in FIG. 3A, depending on the pH of the etch solution and the wall material 310 used to form the features 315. For example, exposed portions of the features 315 may exhibit a positive surface potential (as shown in FIG. 3A) when the substrate 300 is exposed to a non-aqueous organic-based etch solution 330 containing hydrofluoric acid mixed with an organic solvent (e.g., IPA, AA, EG or PC) and the wall material 310 includes a silicon-containing material, such as amorphous silicon (a-Si), polysilicon (poly-Si), silicon nitride (SiN), silicon carbon nitride (SiCN) or silicon oxynitride (SiON).

When the substrate 300 is exposed to a non-aqueous organic-based etch solution 330, as shown in FIG. 3A and described above, the anions within the etchant chemical are attracted to the positively charged surface. This increases the local concentration of anions within the features 315, which increases the etch rate of the material 325 deposited within the features 315 compared to the more planar areas 320 of the substrate 300. Thus, the material 325 is etched faster within the plurality of features 315 and slower within the more planar areas 320 of the substrate 300. When features 315 (e.g., gaps) of different CD are formed between the plurality of structures 305 (e.g., fins), as shown in FIG. 3A, the increase in etch rate is more pronounced within features having smaller CD (such as feature 315a) and less pronounced within features having larger CD (such as feature 315b). However, the etch rate within the features 315 is significantly faster than the etch rate achieved across the more planar areas 320 of the substrate 300.

In the embodiment shown in FIG. 3B, the substrate 300 is exposed to an aqueous-based etch solution 340 that includes one or more etchant chemicals and an aqueous solvent. As noted above, an aqueous-based etch solution 340 is a solution that includes an etchant chemical mixed with an aqueous solvent (e.g., water ($H_2O$) or deionized water). Examples of etchant chemicals that may be included within an aqueous-based etch solution 340 include, but are not limited to, hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH), Tetramethylammonium hydroxide (TMAH) and other etchant chemicals containing an anion (negatively charged ion) as the main reactive species.

Figure 5:
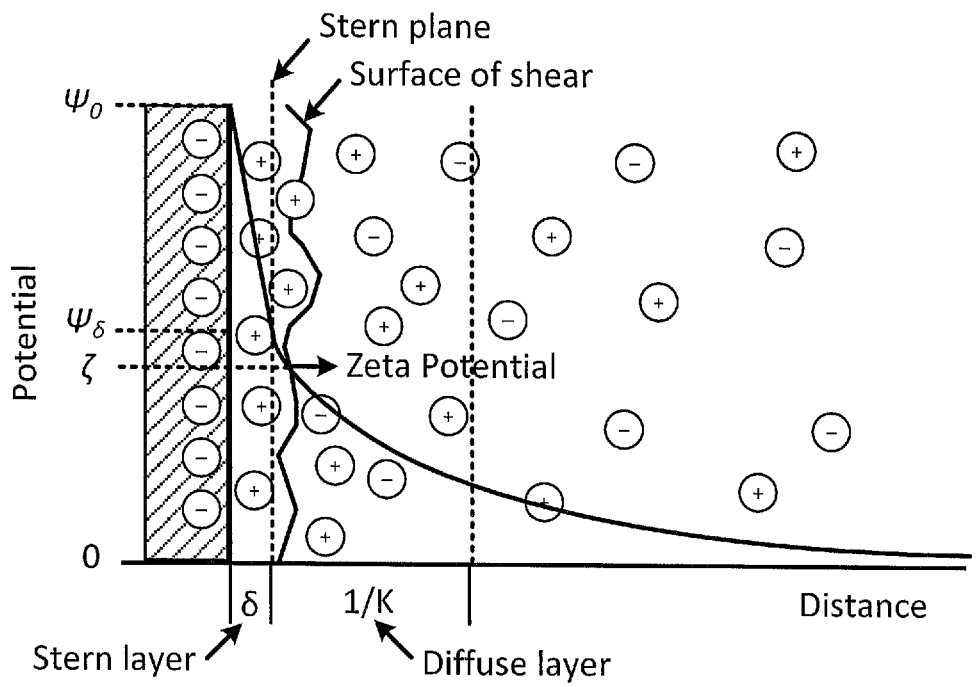
FIG. 5 is a schematic diagram illustrating the Zeta potential and the electric double layer (EDL) that exists between a charged wall surface and the etch solution.

When the substrate 300 is exposed to an aqueous-based etch solution 340 containing anions as the main reactive species, portions of the features 315 exposed to the aqueous-based etch solution 340 may exhibit a negative surface potential, as shown in FIG. 3B, depending on the pH of the etch solution and the wall material 310 used to form the features 315. For example, exposed portions of the features 315 may exhibit a negative surface potential (as shown in FIG. 3B) when the substrate 300 is exposed to an aqueous-based etch solution 340 containing hydrofluoric acid mixed with water and the wall material 310 includes a silicon-containing material, such as amorphous silicon (a-Si), polysilicon (poly-Si), silicon carbon nitride (SiCN) or silicon oxynitride (SiON). However, other silicon-containing materials, such as silicon nitride (SiN), may exhibit a positive surface potential (not shown in FIG. 3B) when the substrate 300 is exposed to an aqueous-based etch solution 340 containing hydrofluoric acid mixed with water. This is shown in FIG. 5 and described in more detail below.

When an aqueous-based etch solution 340 is used to etch the material 325 deposited within the features 315, as shown in FIG. 3B, the etch rate of the material 325 depends, at least in part, on the wall material 310 adjacent to the material 325 being etched. When substrate 300 is exposed to an aqueous-based etch solution 340 and the material 325 being etched is adjacent to a wall material 310 having a negative surface potential, as shown in FIG. 3B, anions within the etchant chemical are repelled by the negatively charged surface. This decreases the local concentration of anions within the features 315, which decreases the etch rate of the material 325 deposited within the features 315 compared to the more planar areas 320 of the substrate 300. When features 315 (e.g., gaps) of different CD are formed between the plurality of structures 305 (e.g., fins), as shown in FIG. 3B, the decrease in etch rate is more pronounced in features having smaller CD (such as feature 315a) and less pronounced in features having larger CD (such as feature 315b). As a result, the material 325 is etched slower in features having smaller CD (such as feature 315a) and faster in features having larger CD (such as feature 315b). As shown in FIG. 3B, the etch rate across the more planar areas 320 of the substrate is significantly faster than the etch rate within the features 315.

When etching the material 325 formed within the plurality of features 315, the etch rate of the material 325 may depend on a variety of factors, including the critical dimension (CD) of the features 315, the particular etchant chemical(s) and/or reactive species used within the etch solution, the particular solvent used within the etch solution, the ratio of etchant chemical(s) to solvent used within the etch solution and/or the pH of the etch solution. In addition to these factors, the electric potential of the wall material 310 adjacent to the material 325 being etched may also affect the etch rate of the material 325, depending on the etch solution used.

As shown in FIGS. 3A-3B and 4, non-aqueous organic-based etch solutions 330 and aqueous-based etch solutions 340 may sometimes have the opposite effect on etch rate. When a non-aqueous organic-based etch solution 330 is used to etch the material 325, the etch rate is increased within features of smaller CD (such as feature 315a) and decreased within features of larger CD (such as feature 315b). However, the opposite is true when an aqueous-based etch solution 340 is used to etch the material 325. This may be due, at least in part, to the Zeta potential and the electric double layer (EDL) that exists between the wall material 310 and the etch solution.

FIG. 5 is a schematic diagram illustrating Zeta potential and the electric double layer that exists between the wall material and the etch solution. The etch solution includes cations (positively charged ions) and anions (negatively charged ions). When the etch solution comes in contact with a wall material having negative surface potential, as shown in FIG. 5, cations within the etch solution are attracted to and adsorbed onto the wall material by electrostatic and/or van der Walls forces. The opposite is true when the etch solution comes in contact with a wall material having positive surface potential (i.e., anions within the etch solution are attracted to and adsorbed onto the wall material). This attraction produces an electric double layer (i.e., a layer that does not satisfy electroneutrality) between the wall material and the etch solution.

According to the Stern model, the electric double layer (EDL) is divided into two parts separated by a plane, referred to as the Stern plane. The centers of adsorbed ions are located in the Stern layer between the wall surface and the Stern plane. Ions with centers located beyond the Stern plane form the Diffuse layer of the EDL. As shown in FIG. 5, the electric potential ($\psi$) near the wall surface changes linearly between $\psi_0$ and $\psi_\delta$ (the potential at the Stern plane) and decays exponentially with distance from $\psi_\delta$ to zero in the Diffuse layer and beyond. The Zeta potential ($\zeta$) is the electric potential that exists at the Surface of Shear between the charged wall surface and the etch solution. The Zeta potential ($\zeta$) may be positive, zero or negative, depending on the wall material and the pH of the etch solution.

Figure 6:
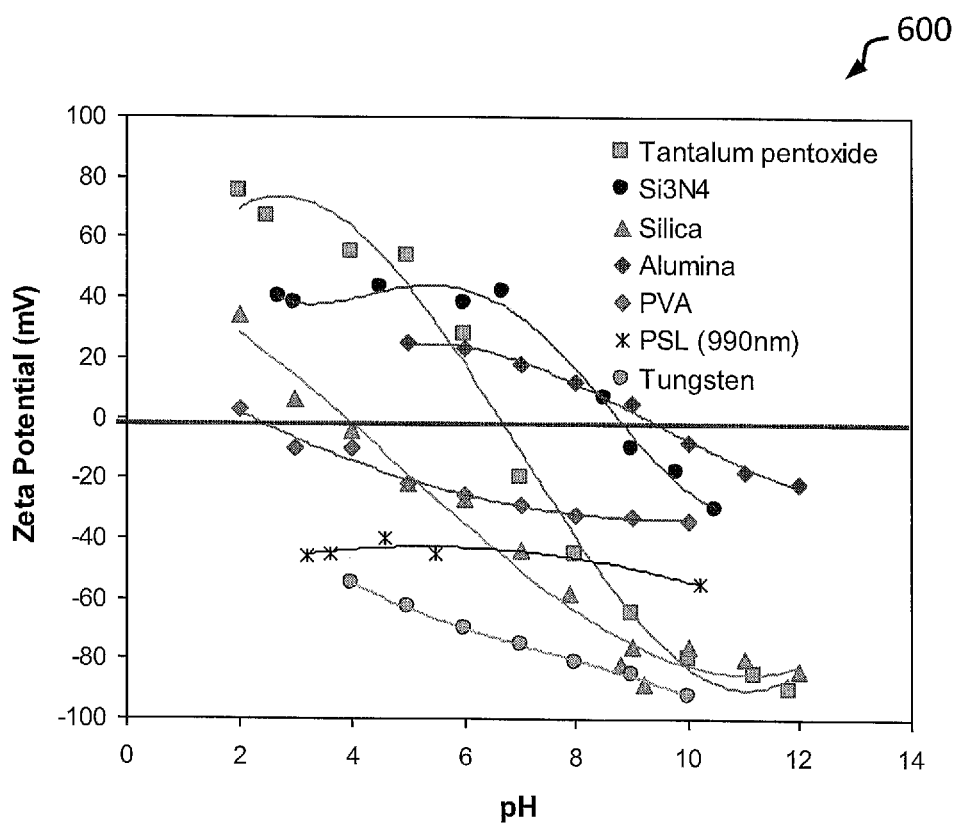
FIG. 6 is a graph illustrating Zeta potential vs pH for various wall materials.

FIG. 6 depicts a graph 600 illustrating Zeta potential (expressed in mV) vs pH for various wall materials. As shown in FIG. 6, the Zeta potential generally increases with decreasing pH and decreases with increasing pH. In some embodiments, the Zeta potential between the charged wall surface and the etch solution can be changed by changing the pH of the etch solution (e.g., by changing the etchant chemical used within the etch solution, or by adding an acid or base to the etch solution), as shown in FIG. 6. In other embodiments, the Zeta potential between the charged wall surface and the etch solution can be changed by adding a surfactant to the etch solution. In yet other embodiments, the Zeta potential between the charged wall surface and the etch solution can be changed by utilizing an organic solvent, instead of an aqueous solvent, within the etch solution (depending on the pH of the etch solution). This is illustrated in the graph 700 shown in FIG. 7.

Figure 7:
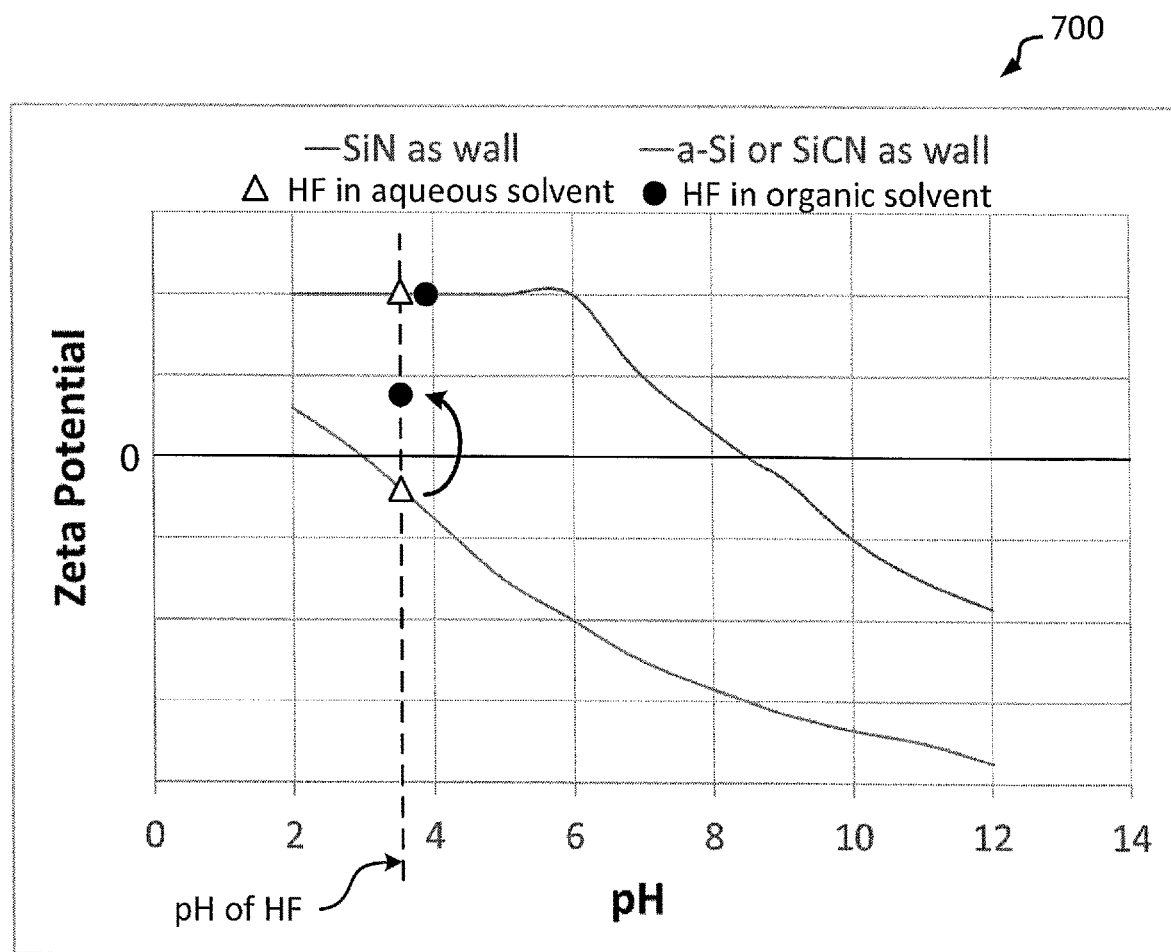
FIG. 7 is a graph illustrating Zeta potential vs pH for various etch solutions and wall materials.

The graph 700 shown in FIG. 7 illustrates the Zeta potential vs pH for various etch solutions and wall materials (e.g., SiN, a-Si and SiCN). When hydrofluoric acid (HF) is mixed with an aqueous solvent and used as an etch solution, the Zeta potential (denoted with a A) between the etch solution and the wall material is: (a) negative for a-Si and SiCN (resulting in a negatively charged wall surface), and (b) positive for SiN (resulting in a positively charged wall surface). When hydrofluoric acid is mixed with organic solvent, instead of an aqueous solvent, the Zeta potential (denoted with a ●) is positive for a-Si, SiCN and SiN (resulting in positively charged wall surfaces). The graph 700 shown in FIG. 7 shows that, while organic solvents have little to no effect on the Zeta potential between an etch solution and an already positively charged wall surface, the Zeta potential between the etch solution and a negatively charged wall surface can (sometimes) be changed to a positive surface potential by using an organic solvent, instead of an aqueous solvent, within the etch solution. This difference in Zeta potential may explain, at least in part, the opposing effects that aqueous-based etch solutions and non-aqueous organic-based solutions have on etch rate when etching features having different CD.

In the graph 700 shown in FIG. 7, an organic solvent is utilized within an HF etch solution to change the Zeta potential of a negatively charged a-Si or SiCN wall surface to a positive surface potential. However, the use of an organic solvent may not be enough to shift the Zeta potential from a negative surface potential to a positive surface potential for all wall surfaces. In some cases, the pH of an organic-based etch solution can be adjusted (e.g., by changing the etchant chemical(s) used within the etch solution, or by adding an acid or base to the etch solution) to further adjust the Zeta potential, thus achieving a positive surface potential and the desired CD-dependent etch results. If the pH cannot be changed (e.g., due to compatibility concerns), a surfactant can be added to the organic-based etch solution to adjust the Zeta potential and achieve the desired CD-dependent etch results. In some cases, all three methods (organic solvent, pH tuning and surfactant addition) can be used to provide or enhance the CD-dependent trend.

In the description provided above, organic-based etch solutions are used (with or without pH tuning and surfactant addition) to increase the etch rate of material formed within features having smaller CD when: (a) the organic-based etch solution contains anions as the main reactive species, and (b) the material being etched is adjacent to a wall material that exhibits a negative surface potential in aqueous solutions. However, organic-based etch solutions may not provide the desired CD-dependent etch results in all embodiments. In some embodiments, an aqueous-based etch solution may be used to increase the etch rate of material formed within features having smaller CD when cations are used as the main reactive species. In some embodiments, the pH may be adjusted and/or a surfactant may be added to an aqueous-based etch solution containing cations as the main reactive species to provide the desired CD-dependent etch results.

As described herein, one mechanism that may cause the variation in etch rates when using the various etch solutions, various wall materials, and various CDs is a mechanism related to surface potentials. However, the techniques described herein are strictly not limited to such techniques. Thus, the CD dependent etch rates described herein may be accomplished through other mechanisms and the etch rate advantages described and obtained with the techniques provided herein are not limited to the particular surface potential mechanisms. Rather, the advantages may be obtained utilizing other mechanisms also.

In FinFET transistor designs, the fins are typically formed from a base substrate layer comprising silicon or another material having a negative surface potential when exposed to aqueous solutions at a given pH range. The present disclosure takes advantage of the difference in etch rate that occurs when non-aqueous organic-based etch solutions and aqueous-based etch solutions are used to etch a material formed within features (e.g., gaps, trenches, holes, etc.).

FIGS. 8A-8F provide cross-sectional views of a substrate 800 undergoing a transistor fabrication process. In particular, FIGS. 8A-8F illustrate a partial transistor fabrication process flow for fabricating a FinFET having a plurality of fins 840. Although eight (8) fins are shown in the illustrated embodiment, it will be recognized that the techniques shown in FIGS. 8A-8F and described herein may be used to form a FinFET having a number (n) of fins, wherein the number (n) is two or more.

Figure 1B:
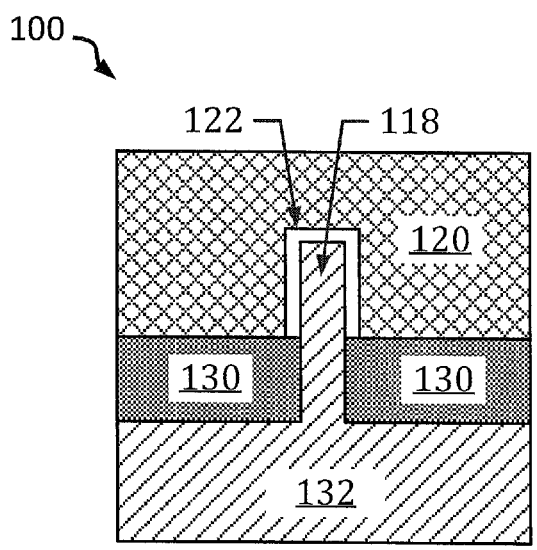
FIG. 1B (Prior Art) is a cross-sectional view through line A-A of FIG. 1A.

The partial transistor fabrication process shown in FIGS. 8A-8F illustrates example process steps that may be performed to form the fins 840 before additional process steps are performed to form other FinFET structures, such as but not limited to, the formation of a gate structure that wraps around the channel region of each fin. The cross-sectional views shown in FIGS. 8A-8F are taken through the plurality of fins 840 in a plane, which is orthogonal to the plurality of fins 840 and parallel to the subsequently formed gate structure. As described below and depicted in the illustrated views, it will be recognized that the plurality of fins 840 extend vertically from a base substrate layer 805 of a patterned substrate 800, similar to that shown and described in FIG. 1A. Although not labeled in the figures, it will also be recognized that each of the raised fins 840 includes source, drain and channel regions, as shown in FIGS. 1A and 1B. It will be further recognized that the subsequently formed gate structure (not shown) may be oriented orthogonal to the raised channel region of the plurality of fins 840.

Figure 8A:
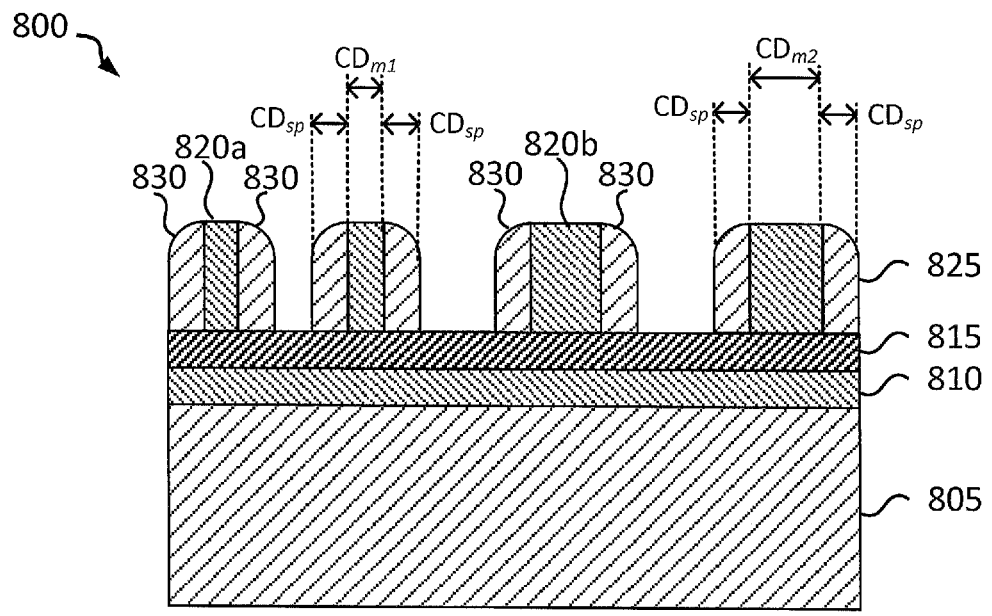
FIGS. 8A-8F illustrate one embodiment of an improved transistor fabrication process that utilizes a wet etch process to control the fin height in a FinFET transistor design having gaps of variable CD.

FIG. 8A is a cross-section diagram of a patterned substrate 800 after a mandrel formation process, spacer deposition process and spacer etch process have been performed to form a plurality of mandrels 820 and sidewall spacers 830 on one or more underlying layers of the patterned substrate 800. Although not strictly limited to such layers, the underlying layers may include a hard mask (HM) layer 815, an antireflective coating (ARC) layer 810 and a base substrate layer 805. It is recognized, however, that different or additional underlying layers could also be provided.

Base substrate layer 805 may be any substrate for which the use of patterned features is desirable. For example, base substrate layer 805 may be a semiconductor substrate having one or more semiconductor processing layers formed thereon. In one embodiment, the base substrate layer 805 may be a substrate that has been subject to multiple semiconductor processing steps which yield a wide variety of structures and layers, all of which are known in the substrate processing art. Non-limiting examples of suitable materials for base substrate layer 805 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. In some embodiments of the present disclosure, the base substrate layer 805 may include a material that exhibits a negative surface potential when exposed to aqueous solutions in a given pH range.

The layer 810, the layer 815 and the spacer layer 825 may be formed from a wide variety of materials, as is known in the art. For example, the layer 810 can be an antireflective coating (ARC) layer, such as spin on carbon (SOC), in some embodiments. However, the layer 810 is not strictly limited to an ARC layer. In some embodiments, layers 810 and 815 can each be one of silicon (Si), spin on carbon (SOC), silicon oxide, silicon nitride (SiN), metal oxide (MeOx), or metal silicon nitride (MeSiN). The spacer layer 825 may be a silicon dioxide ($SiO_2$), SiN, Si, MeOx, or MeSiN layer, which is deposited by conformal deposition using atomic layer deposition (ALD) or chemical vapor deposition (CVD). The key is high selectivity between each other during dry etch for layer 825, 815, 810 and 805. Other materials may be used to form the layer 815, the layer 810 and the spacer layer 825, as is known in the art.

The plurality of mandrels 820 may be formed by depositing a core material (e.g., silicon, silicon nitride, hard mask materials, spin on carbon (SOC), photoresist, silicon oxide, etc.) on the HM layer 815 and etching the core material to form the mandrels. In some embodiments, the mandrels 820 may be formed using a variety of a plasma deposition and plasma etch processes. In some cases, the mandrels 820 may be formed having a uniform width, or critical dimension ($CD_m$). In other cases, mandrels 820 of different CD may be formed on the underlying layers. In the embodiment shown in FIG. 8A, for example, the patterned substrate 800 includes mandrels 820a having smaller CD ($CD_{m1}$) and mandrels 820b having larger CD ($CD_{m2}$). Although mandrels of two different size are illustrated, the patterned substrate 800 may alternatively include any number of mandrels, where one or more of the mandrels are formed having a different CD.

After the plurality of mandrels 820 are formed on the underlying layers, a spacer layer 825 may be deposited over the mandrels 820 and etched to remove a portion of the spacer layer 825, leaving spacers 830 adjacent to the mandrels 820. The spacer etch process also exposes the mandrels 820. Like the mandrels 820, the spacers 830 may be formed using a variety of a plasma deposition and plasma etch processes. The spacers 830 formed adjacent to the mandrels 820 have a uniform width, or critical dimension ($CD_{sp}$), which is not dependent on the width of the mandrels.

Figure 8B:
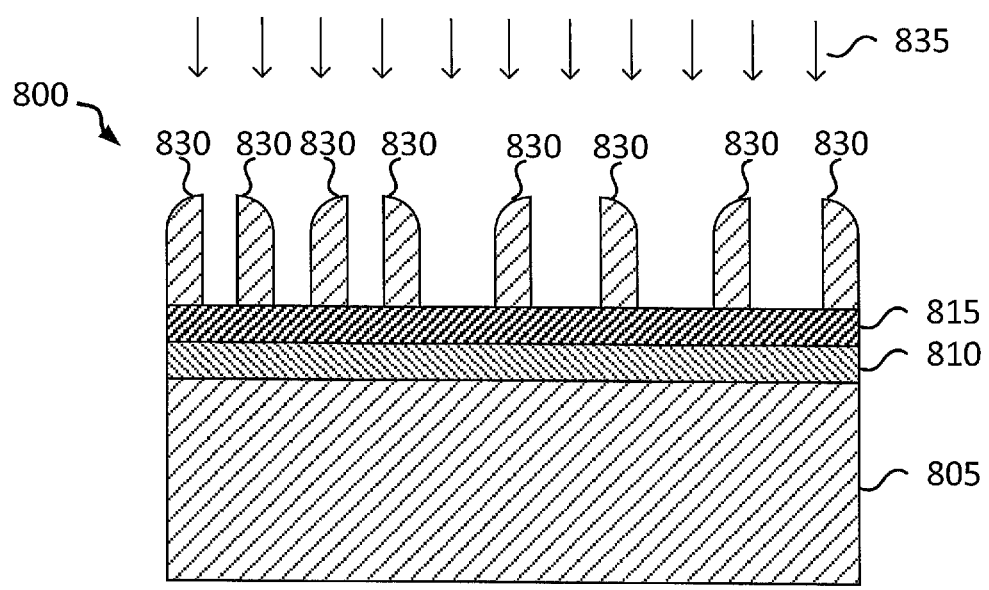

FIG. 8B is a cross-section diagram of the patterned substrate 800 after a mandrel pull process has been performed to remove the mandrels 820 from the spacers 830. In some embodiments, the mandrels 820 may be removed using a plasma etch process, which removes the mandrels 820 by exposing the patterned substrate 800 to a plasma 835. Ions and reactive species within the plasma 835 selectively etch the material used to form the mandrels 820, leaving the spacers 830 on the underlying layers.

Figure 8C:
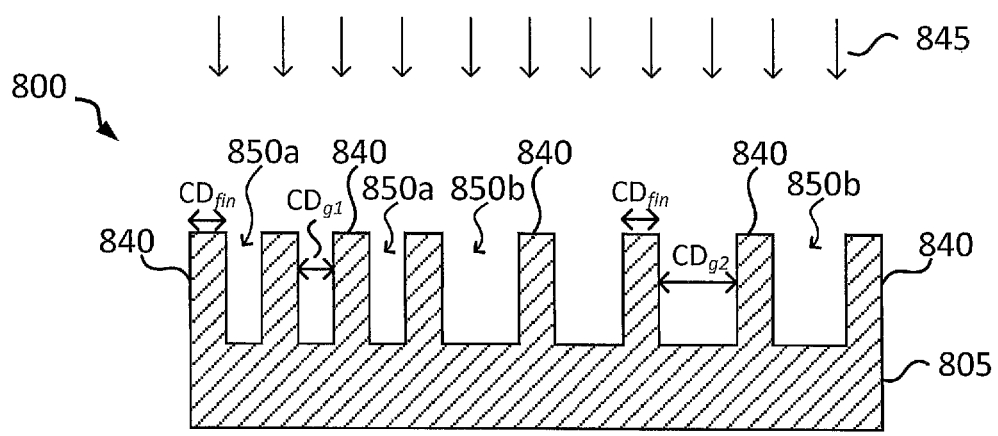

FIG. 8C is a cross-section diagram of the patterned substrate 800 after a fin etch process has been performed to etch the underlying layers and form a plurality of fins 840 within the base substrate layer 805. In some embodiments, the plurality of fins 840 may be formed by exposing the patterned substrate 800 to a plasma 845. Ions and reactive species within the plasma 845 selectively etch portions of the underlying layers (e.g., the HM layer 815, ARC layer 810 and base substrate layer 805) not covered by the spacers 830 to form gaps 850 between the plurality of fins 840.

During the fin etch process, the spacers 830 are used as a mask for etching the exposed portions of the underlying layers to form the gaps 850 between the fins 840. As a result of such etching, the plurality of fins 840 formed on the patterned substrate 800 may have a uniform width, or critical dimension ($CD_{fin}$), which is dependent on and substantially equal to the critical dimension ($CD_{sp}$) of the spacers 830 used to form the fins 840. However, the CD of the gaps 850 formed between the fins 840 is dependent on the width of the mandrels 820, and thus, may differ when different sized mandrels are used. In the example embodiment shown in FIG. 8C, the CD of the gaps 850 formed between the plurality of fins 840 varies across the patterned substrate 800. For example, some of the fins 840 are separated by gaps 850a having smaller CD ($CD_{g1}$), while other fins 840 are separated by gaps 850b having larger CD ($CD_{g2}$).

Figure 8D:
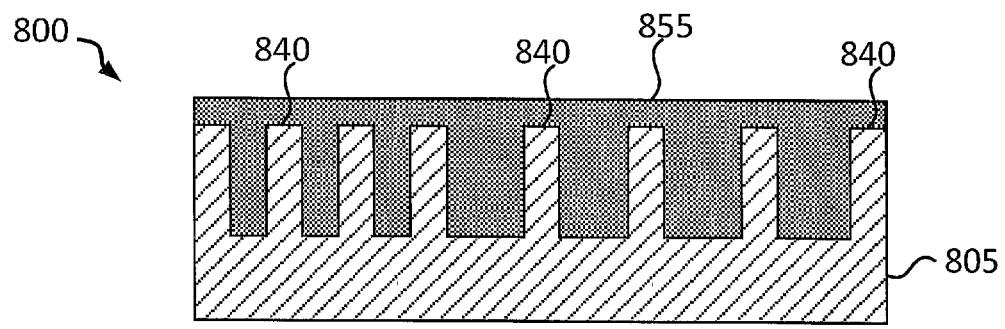

FIG. 8D is a cross-section diagram of the patterned substrate 800 after an oxide deposition process has been performed to deposit an oxide material 855 on the surface of the patterned substrate 800 and within the gaps 850 formed between the plurality of fins 840. A wide variety of oxide materials may be deposited in FIG. 8D, including for example, silicon dioxide ($SiO_2$) and other dielectric materials. In some embodiments, the oxide material 855 may be deposited using a plasma deposition process. Once the oxide material 855 is deposited, the oxide material 855 may be etched to control the fin height (H) of the plurality of fins 840.

Figure 2A:
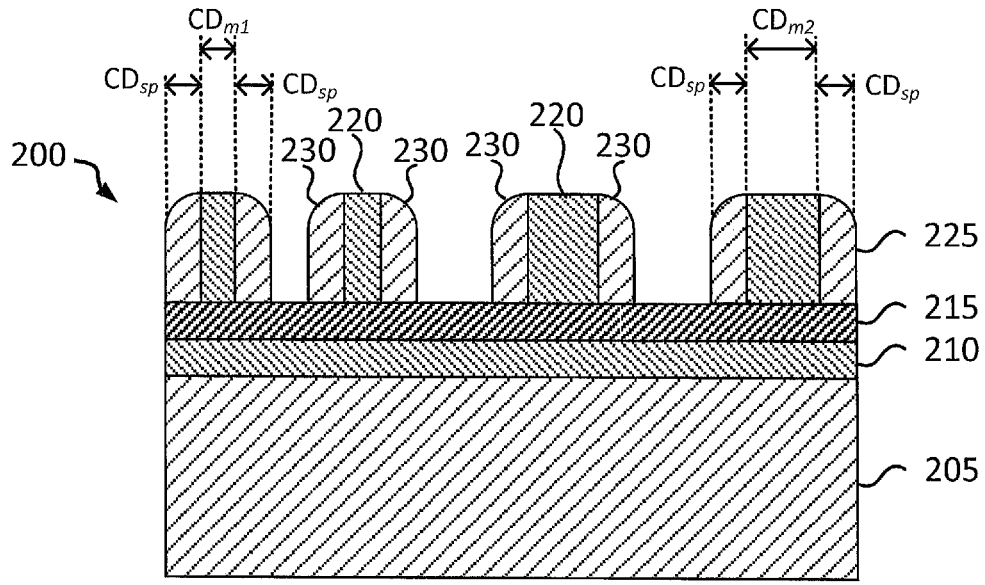
FIGS. 2A-2F (Prior Art) illustrates an example process flow that may be used to form the fins of a FinFET transistor in a conventional FinFET fabrication process.
Figure 2B:
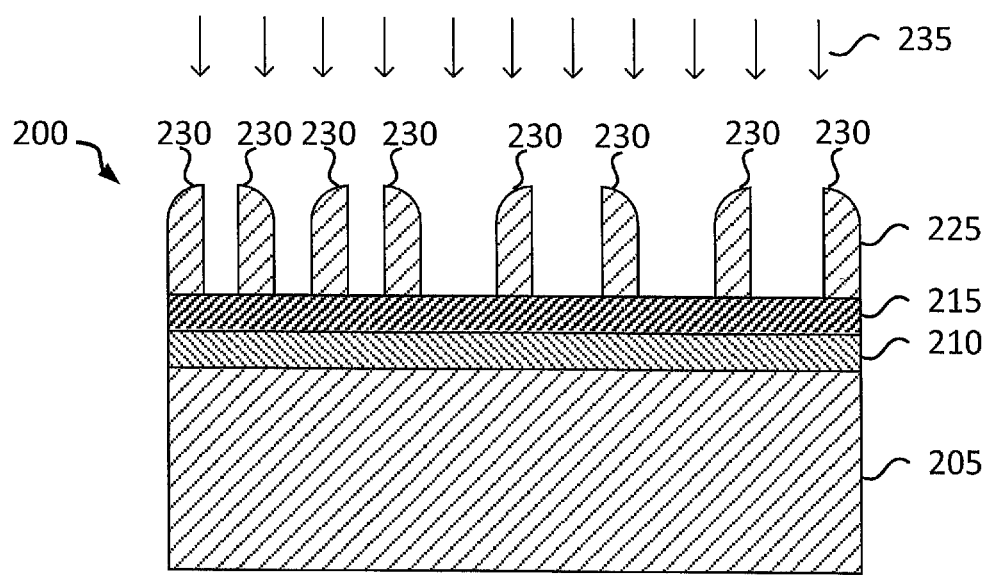
Figure 2C:
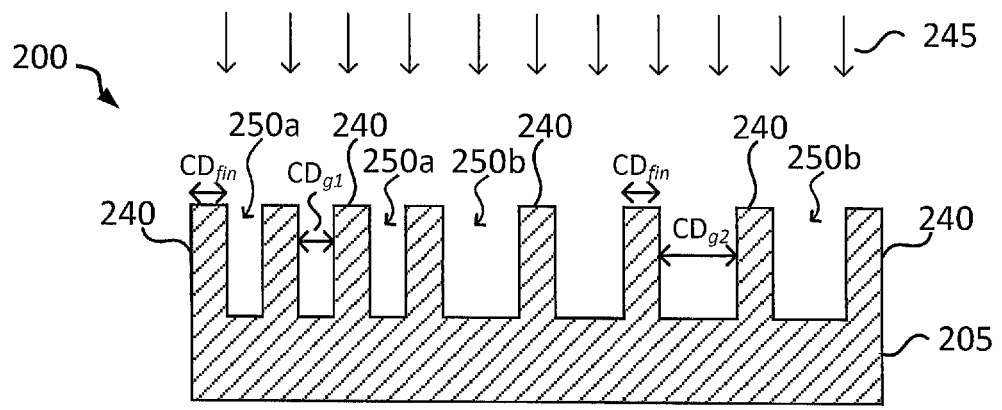
Figure 2D:
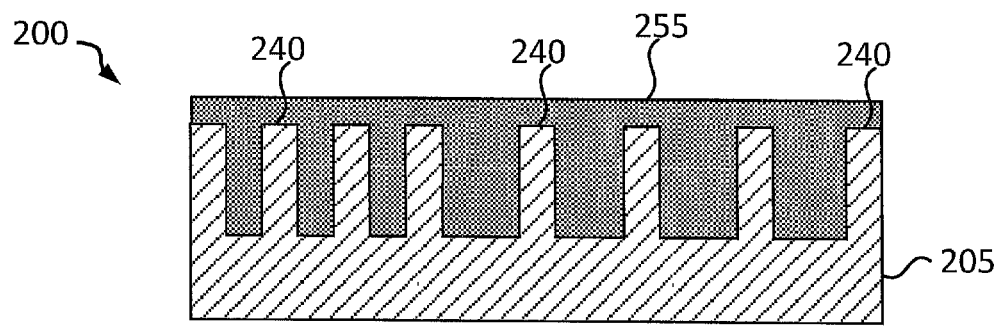
Figure 2E:
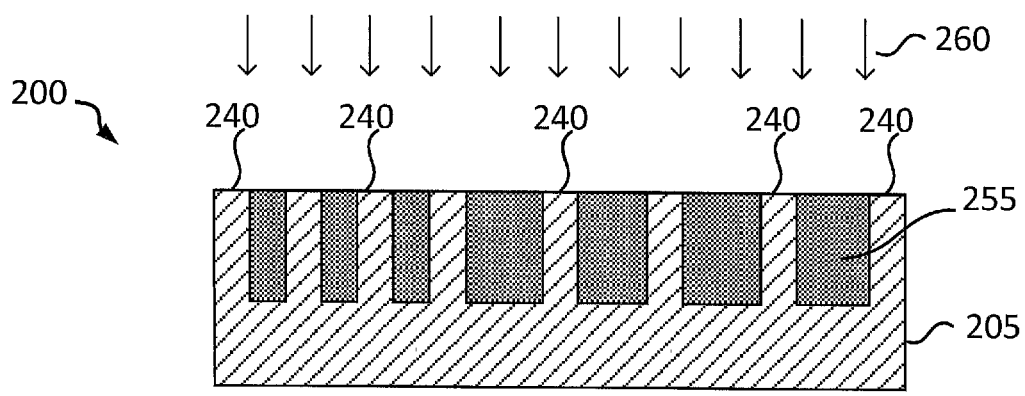
Figure 2F:
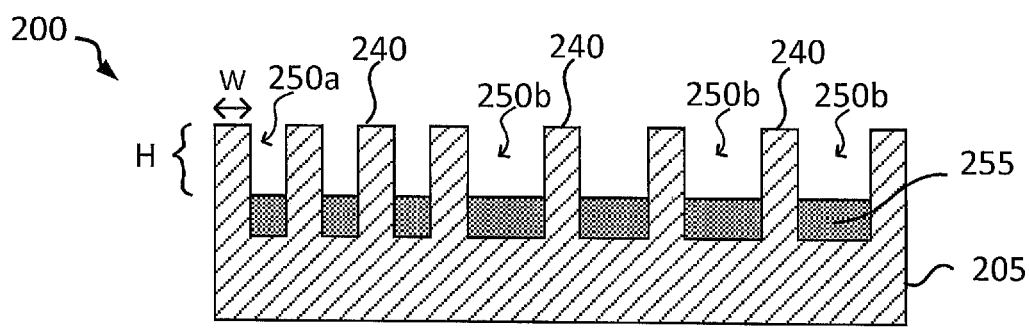

The process steps shown in FIGS. 8A-8D and described above are similar to the conventional SADP process steps shown in FIGS. 2A-2D. In the conventional SADP process flow, a dry etch process is utilized in FIGS. 2E-2F to remove the oxide material 255, which is deposited on the surface of the substrate and within the gaps 250 formed between the fins 240. The dry etch process produces fins 240 having constant width (W) and constant height (H). This provides limited control over the channel area and makes it impossible to individually control fin height for one or more of the fins 240 included within the FinFET.

Figure 8E:
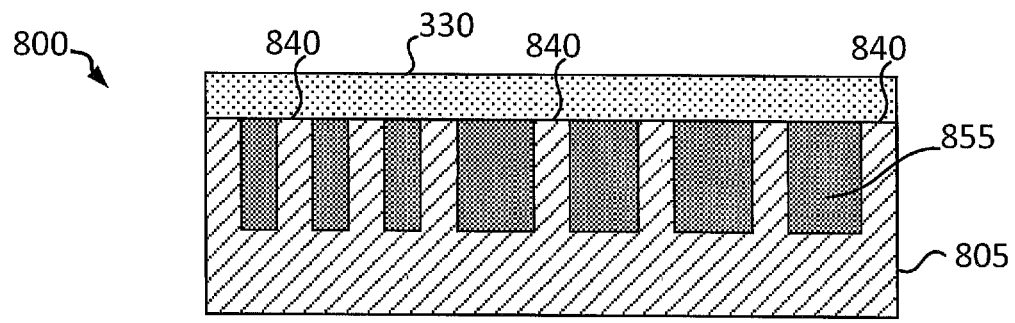
Figure 8F:
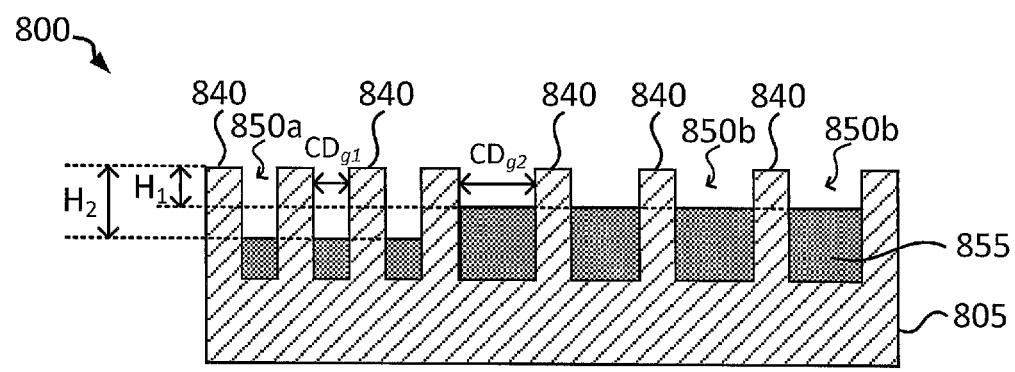
Figure 8G:
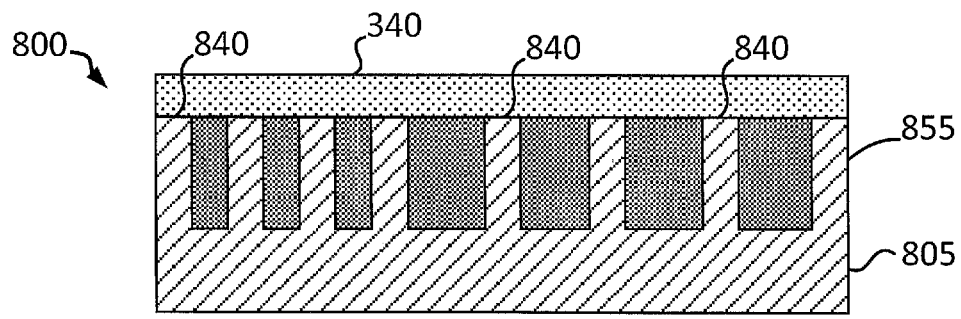
Figure 8H:
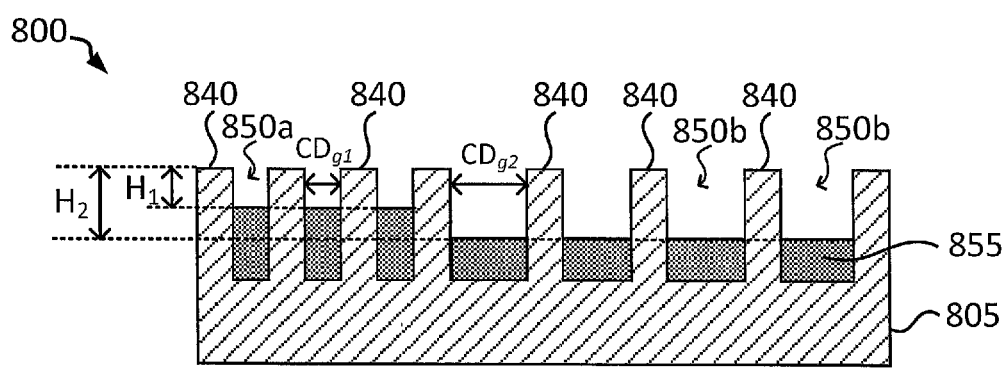

Unlike the conventional process flow shown in FIGS. 2A-2F, the improved process flow described herein utilizes a wet etch process to etch the oxide material 855, which is deposited on the surface of the patterned substrate 800 and within the gaps 850 formed between the fins 840. In some embodiments, the wet etch process described herein may utilize a non-aqueous organic based etch solution 330 (containing anions as the main reactive species) to etch the oxide material 855, as shown in FIGS. 8E-8F. In other embodiments, the wet etch process described herein may utilize an aqueous-based etch solution 340 (containing anions as the main reactive species) to etch the oxide material 855, as shown in FIGS. 8G-8H. By utilizing a wet etch process, instead of the dry etch process used in conventional process flows, the improved process flow described herein takes advantage of the CD-dependent etching provided by wet etch processes to more precisely control fin height in a FinFET transistor design having gaps of variable CD.

FIGS. 8E-8F illustrate one embodiment of a wet etch process that may be used in the improved process flow described herein to control the fin height in a FinFET transistor design having gaps 850 of variable CD. The wet etch process shown in FIGS. 8E-8F utilizes a non-aqueous organic-based etch solution 330 containing anions as the main reactive species to etch the oxide material 855 deposited within the gaps 850 and control the height (H) of the fins 840.

In FIG. 8E, the patterned substrate 800 is exposed to a non-aqueous organic-based etch solution 330 (i.e., an etch solution that includes one or more etchant chemicals mixed with an organic solvent). Examples of etchant chemicals containing anions as the main reactive species and organic solvents are disclosed above. In one example embodiment, the patterned substrate 800 may be exposed to a non-aqueous organic-based etch solution 330 comprising hydrofluoric acid (HF) or buffered HF (e.g., HF mixed with ammonium fluoride ($NH_4F$)) mixed with an organic solvent (e.g., ethylene glycol (EG) or isopropyl alcohol (IPA)). It is recognized, however, that other non-aqueous organic-based etch solutions 330 may also be used. When the patterned substrate 800 is exposed to a non-aqueous organic-based etch solution 330 containing anions as the main reactive species, as shown in FIG. 8E, the non-aqueous organic-based etch solution 330 etches the oxide material 855 faster within gaps 850a having smaller CD ($CD_{g1}$) and slower within gaps 850b having larger CD ($CD_{g2}$), as shown in FIG. 8F.

In the embodiment shown in FIGS. 8E-8F, the non-aqueous organic-based etch solution 330 provides a faster etch rate within the gaps 850a having smaller CD ($CD_{g1}$) and a slower etch rate within the gaps 850b having larger CD ($CD_{g2}$) when: (a) anions are used as the main reactive species, and (b) the material being etched (e.g., the oxide material 855) is adjacent to a wall material that exhibits a negative surface charge when exposed to aqueous solutions of certain pH. However, the etch solution is not strictly limited to the example etch solution described above. In one alternative embodiment, a faster etch rate may be provided within the gaps 850a having smaller CD ($CD_{g1}$) and a slower etch rate may be provided within the gaps 850b having larger CD ($CD_{g2}$) by using an aqueous-based etch solution 340 containing cations as the main reactive species, when the material being etched (e.g., the oxide material 855) is adjacent to a wall material that exhibits a negative surface charge when exposed to aqueous solutions of certain pH.

When the material being etched (e.g., the oxide material 855) is adjacent to a wall material that exhibits a positive surface charge in aqueous solutions of certain pH, alternative etch solutions may be used to provide a faster etch rate within the gaps 850a having smaller CD ($CD_{g1}$) and a slower etch rate within the gaps 850b having larger CD ($CD_{g2}$). For example, when the wall surface is positively charged in aqueous solutions, the etch solution may alternatively include: (a) an aqueous-based etch solution or a non-aqueous organic-based etch solution containing anions as the main reactive species, or (b) an aqueous-based etch solution containing cations as the main reactive species. In some embodiments, the pH of the etch solution may be adjusted and/or a surfactant may be added to the etch solution to change the surface potential of the wall material adjacent to the material being etched and provide the desired CD-dependent etch results.

FIGS. 8G-8H illustrate another embodiment of a wet etch process that may be used in the improved process flow described herein to control the fin height in a FinFET transistor design having gaps 850 of variable CD. The wet etch process shown in FIGS. 8G-8H utilizes an aqueous-based etch solution 340 containing anions as the main reactive species to etch the oxide material 855 deposited within the gaps 850 and control the height (H) of the fins 840.

In FIG. 8G, the patterned substrate 800 is exposed to an aqueous-based etch solution 340 (i.e., an etch solution that includes one or more etchant chemicals mixed with an aqueous solvent). Examples of etchant chemicals containing anions as the main reactive species and aqueous solvents are disclosed above. In one example embodiment, the patterned substrate 800 may be exposed to an aqueous-based etch solution 340 comprising hydrofluoric acid (HF) or buffered HF (e.g., HF mixed with ammonium fluoride ($NH_4F$)) mixed with water. It is recognized, however, that other aqueous-based etch solutions 340 may also be used. When the patterned substrate 800 is exposed to an aqueous-based etch solution 340 containing anions as the main reactive species, as shown in FIG. 8G, the aqueous-based etch solution 340 etches the oxide material 855 slower within gaps 850a having smaller CD ($CD_{g1}$) and faster within gaps 850b having larger CD ($CD_{g2}$), as shown in FIG. 8H.

In the embodiment shown in FIGS. 8G-8H, the aqueous-based etch solution 340 provides a slower etch rate within the gaps 850a having smaller CD ($CD_{g1}$) and a faster etch rate within the gaps 850b having larger CD ($CD_{g2}$) when: (a) anions are used as the main reactive species, and (b) the material being etched (e.g., the oxide material 855) is adjacent to a wall material that exhibits a negative surface charge when exposed to aqueous solutions of certain pH. However, the etch solution is not strictly limited to the example etch solution described above. In one alternative embodiment, a slower etch rate may be provided within the gaps 850a having smaller CD ($CD_{g1}$) and a faster etch rate may be provided within the gaps 850b having larger CD ($CD_{g2}$) by using a non-aqueous organic-based etch solution 330 containing cations as the main reactive species, when the material being etched (e.g., the oxide material 855) is adjacent to a wall material that exhibits a negative surface charge when exposed to aqueous solutions of certain pH.

When the material being etched (e.g., the oxide material 855) is adjacent to a wall material that exhibits a positive surface charge in aqueous solutions of certain pH, alternative etch solutions may be used to provide a slower etch rate within the gaps 850a having smaller CD ($CD_{g1}$) and a faster etch rate within the gaps 850b having larger CD ($CD_{g2}$). For example, when the wall surface is positively charged in aqueous solutions, the etch solution may alternatively include an aqueous-based etch solution containing anions or cations as the main reactive species. In some embodiments, the pH of the etch solution may be adjusted and/or a surfactant may be added to the etch solution to change the surface potential of the wall material adjacent to the material being etched and provide the desired CD-dependent etch results.

The wet etch processes shown in FIGS. 8E-8F and FIGS. 8G-8H produce fins 840 having constant width (W), but variable height ($H_1$ and $H_2$). In the embodiment shown in FIGS. 8E-8F, fins 840 separated by smaller gaps ($CD_{g1}$) are taller (i.e., have larger height, $H_2$) than the fins 840 separated by larger gaps ($CD_{g2}$). In the embodiment shown in FIGS. 8G-8H, fins 840 separated by gaps 850a having smaller CD ($CD_{g1}$) are shorter (i.e., have smaller height, $H_1$) than the fins 840 separated by gaps 850b having larger CD ($CD_{g2}$).

Various embodiments of improved transistor fabrication processes, which utilize a wet etch process to control the fin height in a FinFET transistor design having gaps of variable CD are illustrated in FIGS. 8A-8F and in FIGS. 8A-8D and 8G-8H. The improved transistor fabrication processes described in the present disclosure take advantage of the CD-dependent etching provided by wet etch processes to more precisely control fin height in a FinFET transistor design having gaps of variable CD. By utilizing a wet etch process, as shown in FIGS. 8E-8F and 8G-8H, the improved process flows described herein enable fin height (H) to be individually controlled for one or more fins 840 of a FinFET, thereby providing greater control over the channel area (n*W*H) of the FinFET. By providing circuit designers with the freedom to control fin height (H) for variable gap CD, the process flows disclosed herein enable circuit designers to form FinFETs having different channel area in different function areas of an integrated circuit device.

Figure 10:
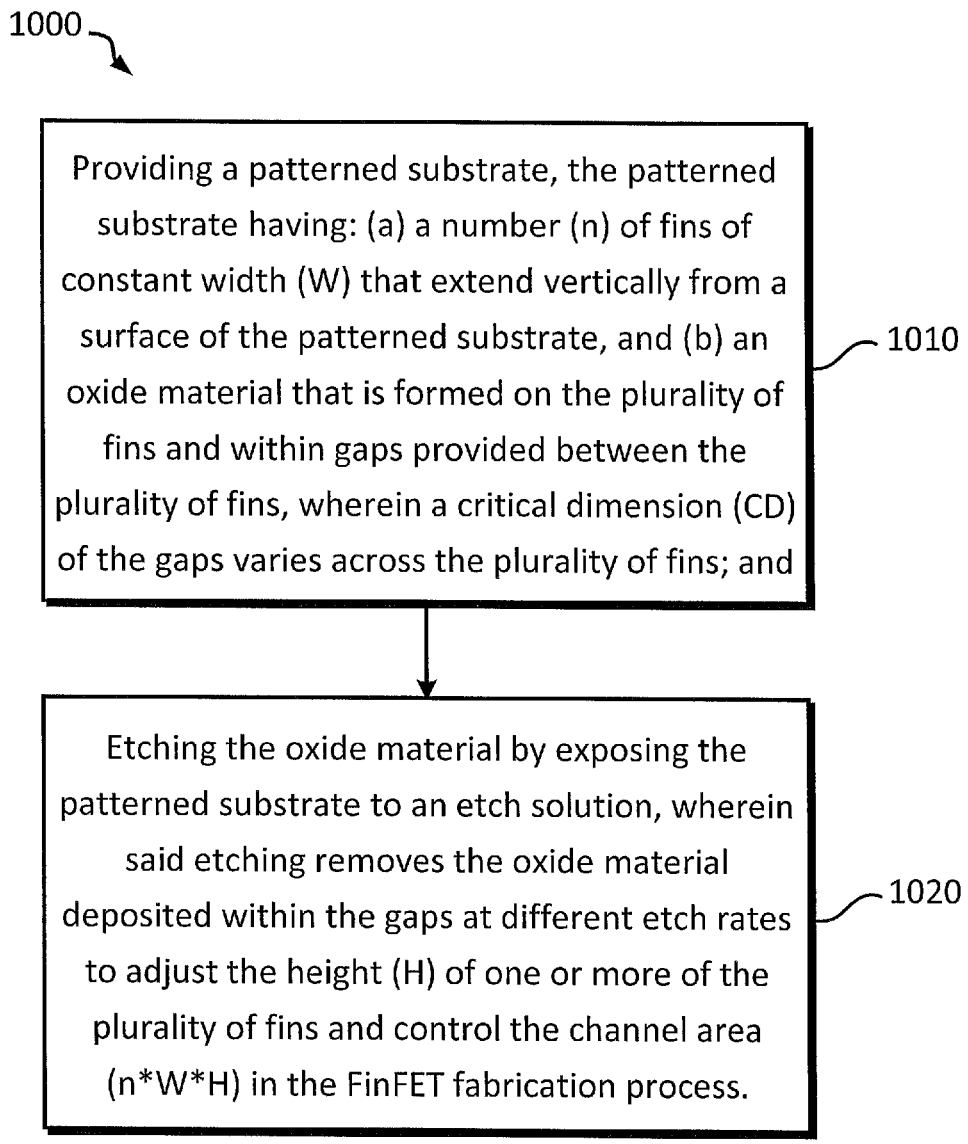
FIG. 10 is a flowchart diagram illustrating one embodiment of a method that uses wet etching to control channel area in a FinFET fabrication process.

FIGS. 9-10 illustrate various embodiments of methods that utilize the techniques described herein to control fin height and channel area in a FinFET having gaps of variable CD. It will be recognized that the embodiments shown in FIGS. 9-10 are merely exemplary and additional processes and methods may utilize the techniques described herein. Further, additional processing steps may be added to the embodiment shown in FIGS. 9-10, as the steps shown in the figures are not intended to be exclusive. Moreover, the order of the steps is not limited to the order shown in the figures, as different orders may occur and/or various steps may be performed in combination or at the same time.

FIG. 9 illustrates one embodiment of a method 900 that uses wet etching to control fin height in a FinFET fabrication process. In some embodiments, the method 900 may begin (in step 910) by providing a patterned substrate having: (a) a plurality of fins that extend vertically from a surface of the patterned substrate, and (b) an oxide material that is formed on the plurality of fins and within gaps provided between the plurality of fins, wherein a width (or CD) of the gaps varies across the plurality of fins. The method 900 may further include (in step 920) etching the oxide material by exposing the patterned substrate to an etch solution, wherein said etching controls the fin height in the FinFET fabrication process by removing the oxide material deposited within the gaps at different etch rates.

FIG. 10 illustrates one embodiment of a method 1000 that uses wet etching to control channel area in a FinFET fabrication process. In some embodiments, the method 1000 may begin (in step 1010) by providing a patterned substrate having: (a) a number (n) of fins of constant width (W) that extend vertically from a surface of the patterned substrate, and (b) an oxide material that is formed on the plurality of fins and within gaps provided between the plurality of fins, wherein a critical dimension (CD) of the gaps varies across the plurality of fins. The method 1000 may further include (in step 1020) etching the oxide material by exposing the patterned substrate to an etch solution, wherein said etching removes the oxide material deposited within the gaps at different etch rates to adjust the height (H) of one or more of the plurality of fins and control the channel area (n*W*H) in the FinFET fabrication process.

In the embodiments shown in FIGS. 9 and 10, the plurality of fins provided on the patterned substrate may include a first set of fins separated by a first gap having a smaller CD and a second set of fins separated by a second gap having a larger CD. In some embodiments of the methods, the etch solution used within the etching step (in step 920 or step 1020) includes one or more etchant chemicals and an organic solvent. In such embodiments, the etching step (step 920 or step 1020) may remove the oxide material from the first gap faster than the oxide material is removed from the second gap to provide the first set of fins with a height, which is greater than the height of the second set of fins. In other embodiments of the methods, the etch solution used within the etching step (in step 920 or step 1020) may include one or more etchant chemicals and an aqueous solvent. In such embodiments, the etching step (step 920 or step 1020) may remove the oxide material from the first gap slower than the oxide material is removed from the second gap to provide the first set of fins with a height, which is less than the height of the second set of fins.

In the embodiments shown in FIGS. 9 and 10, the method 900 and the method 1000 use a wet etch process to remove the oxide material deposited within the gaps at different etch rates. By using a wet etch process, instead of a dry etch process, the method embodiments shown in FIGS. 9 and 10 are able to adjust or individually control the fin height (H) for one or more fins of a FinFET. By adjusting the fin height (H) of one or more fins, the embodiment shown in FIG. 10 provides greater control over the channel area (n*W*H) in the FinFET fabrication process. In some embodiments (not shown), method 1000 may adjust the number (n) of fins included on the patterned substrate to further control the channel area (n*W*H) in the FinFET fabrication process.

In the embodiments shown in FIGS. 9 and 10, a wide variety of etchant chemical(s) may be used within the etch solutions. In some embodiments, the etchant chemical(s) may comprise at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). A wide variety of organic solvents may also be used within the etch solutions. Examples of organic solvents that may be included within a non-aqueous organic-based etch solution include, but are not limited to, methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

Improved process flows and methods for controlling fin height and channel area in a FinFET having gaps of variable CD are described in various embodiments. In the disclosed embodiments, a wet etch process is utilized to control the fin height and channel area in a FinFET having gaps of variable CD. The wet etch process may utilize a non-aqueous organic-based etch solution 330 or the aqueous-based etch solution 340, as described above. In the example embodiments shown in FIGS. 3A-3B, 8E-8F and 8G-8H, the etchant chemical utilized within the non-aqueous organic-based etch solution 330 and the aqueous-based etch solution 340 includes an anion (negatively charged ion) as the main reactive species.

In alternative embodiments of the present disclosure (not illustrated), the etchant chemical utilized within the non-aqueous organic-based etch solution 330 and the aqueous-based etch solution 340 may contain a cation (positively charged ion) as the main reactive species. When a cation is used as the main reactive species, the non-aqueous organic-based etch solution 330 and the aqueous-based etch solution 340 may provide an etching effect, which is opposite to that which is shown in FIGS. 3A-3B, 8E-8F and 8G-8H. For example, when a cation is used as the main reactive species, the non-aqueous organic-based etch solution 330 may etch the material 325 slower in features having smaller CD (such as feature 315a) and faster in features having larger CD (such as feature 315b). Likewise, when a cation is used as the main reactive species, the aqueous-based etch solution 340 may etch the material 325 faster in features having smaller CD (such as feature 315a) and slower in features having larger CD (such as feature 315b).

The improved process flows and methods may generally be used to form one or more FinFETs on a substrate, wherein each FinFET comprises a plurality of fins, and wherein the plurality of fins are separated by gaps having variable CD. As used herein, the term "substrate" means and includes a base material or construction upon which materials are formed. The substrate may include any material portion or structure of a device (particularly a semiconductor or other electronics device), and may, for example, be a base substrate structure (such as a semiconductor substrate) or a layer on or overlying a base substrate structure (such as a thin film). Thus, the term "substrate" is not intended to be limited to any particular base structure, underlying layer or overlying layer, patterned layer or unpatterned layer. Rather, the term "substrate" is contemplated to include any such layer or base structure, and any combination of layers and/or base structures.

It will be appreciated that the substrate described herein may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures, features or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

It is noted that reference throughout this specification to "one embodiment" or "an embodiment" means that a particular feature, structure, material or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments described herein may be practiced without one or more of the specific details, or with other replacement and/or additional methods, materials or components. In other instances, well-known structures, materials or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the processes and methods described herein will be apparent to those skilled in the art in view of this description. It will be recognized, therefore, that the described processes and methods are not limited by the examples described herein. It is to be understood that the forms of the processes and methods described herein are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method that uses wet etching to control fin height in a fin field effect transistor (FinFET) fabrication process, the method comprising:
providing a patterned substrate, the patterned substrate having: (a) a plurality of fins that extend vertically from a surface of the patterned substrate, and (b) an oxide material that is formed on the plurality of fins and within gaps provided between the plurality of fins, wherein a critical dimension (CD) of the gaps varies across the plurality of fins; and
etching the oxide material by exposing the patterned substrate to an etch solution, wherein said etching controls the fin height in the FinFET fabrication process by removing the oxide material from the gaps between the plurality of fins at different etch rates.

2. The method of claim 1, wherein the plurality of fins comprise a first set of fins separated by a first gap having a smaller CD and a second set of fins separated by a second gap having a larger CD.

3. The method of claim 2, wherein the etch solution includes one or more etchant chemicals and an organic solvent.

4. The method of claim 3, wherein said etching removes the oxide material from the first gap faster than the oxide material is removed from the second gap to provide the first set of fins with a height, which is greater than the height of the second set of fins.

5. The method of claim 3, wherein the one or more etchant chemicals comprise at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

6. The method of claim 3, wherein the organic solvent comprises one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

7. The method of claim 2, wherein the etch solution includes one or more etchant chemicals and an aqueous solvent.

8. The method of claim 7, wherein said etching removes the oxide material from the first gap slower than the oxide material is removed from the second gap to provide the first set of fins with a height, which is less than the height of the second set of fins.

9. The method of claim 7, wherein the one or more etchant chemicals comprise at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

10. The method of claim 1, wherein the plurality of fins comprise a silicon containing material that exhibits a negative surface potential when exposed to aqueous solutions in a given pH range.

11. A method that uses wet etching to control channel area in a fin field effect transistor (FinFET) fabrication process, the method comprising:
providing a patterned substrate, the patterned substrate having: (a) a number (n) of fins of constant width (W) that extend vertically from a surface of the patterned substrate, and (b) an oxide material that is formed on the plurality of fins and within gaps provided between the plurality of fins, wherein a critical dimension (CD) of the gaps varies across the plurality of fins; and
etching the oxide material by exposing the patterned substrate to an etch solution, wherein said etching removes the oxide material from the gaps between the plurality of fins at different etch rates to adjust the height (H) of one or more of the plurality of fins and control the channel area (n*W*H) in the FinFET fabrication process.

12. The method of claim 11, wherein the plurality of fins comprise a first set of fins separated by a first gap having a smaller CD and a second set of fins separated by a second gap having a larger CD.

13. The method of claim 12, wherein the etch solution includes one or more etchant chemicals and an organic solvent.

14. The method of claim 13, wherein said etching removes the oxide material from the first gap faster than the oxide material is removed from the second gap to provide the first set of fins with a height, which is greater than the height of the second set of fins.

15. The method of claim 13, wherein the one or more etchant chemicals comprise at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

16. The method of claim 13, wherein the organic solvent comprises one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

17. The method of claim 12, wherein the etch solution includes one or more etchant chemicals and an aqueous solvent.

18. The method of claim 17, wherein said etching removes the oxide material from the first gap slower than the oxide material is removed from the second gap to provide the first set of fins with a height, which is less than the height of the second set of fins.

19. The method of claim 17, wherein the one or more etchant chemicals comprise at least one of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

20. The method of claim 11, further comprising adjusting the number (n) of fins included on the patterned substrate to further control the channel area (n*W*H) in the FinFET fabrication process.

* * * * *